United States Patent
Luther et al.

(10) Patent No.: US 9,324,562 B1
(45) Date of Patent: Apr. 26, 2016

(54) METAL HALIDE SOLID-STATE SURFACE TREATMENT FOR NANOCRYSTAL MATERIALS

(71) Applicants: Alliance for Sustainable Energy, LLC, Golden, CO (US); Colorado School of Mines, Golden, CO (US)

(72) Inventors: Joseph M. Luther, Boulder, CO (US); Ryan Crisp, Golden, CO (US); Matthew C. Beard, Arvada, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 14/939,928

(22) Filed: Nov. 12, 2015

Related U.S. Application Data (60) Provisional application No. 62/078,559, filed on Nov. 12, 2014.

(51) Int. Cl.
  *H01L 21/20* (2006.01)
  *H01L 21/36* (2006.01)
  *H01L 21/02* (2006.01)

(52) U.S. Cl.
  CPC .... *H01L 21/02568* (2013.01); *H01L 21/02601* (2013.01); *H01L 21/02628* (2013.01)

(58) Field of Classification Search
  CPC .................. H01L 21/02568; H01L 21/02601; H01L 21/20628
  USPC ....................................... 438/478
  See application file for complete search history.

(56) References Cited

U.S. PATENT DOCUMENTS

| | | | |
|---|---|---|---|
| 8,936,734 B2 * | 1/2015 | Landry | C01B 3/06 252/372 |
| 9,059,418 B2 | 6/2015 | Seok et al. | |
| 2005/0036938 A1 | 2/2005 | Hyeon | |
| 2012/0104325 A1 | 5/2012 | Talapin et al. | |
| 2013/0019930 A1 * | 1/2013 | Semonin | H01L 21/02422 136/255 |
| 2013/0255754 A1 | 10/2013 | Friend et al. | |
| 2014/0158950 A1 | 6/2014 | Helms et al. | |
| 2014/0220724 A1 | 8/2014 | Duty et al. | |
| 2014/0272623 A1 | 9/2014 | Jennings | |
| 2014/0346442 A1 | 11/2014 | Nag et al. | |
| 2015/0129838 A1 | 5/2015 | Lewis et al. | |

FOREIGN PATENT DOCUMENTS

WO     WO 2014/180789 A1     11/2014

OTHER PUBLICATIONS

Bae et al., "Highly Effective Surface Passivation of PbSe Quantum Dots through Reaction with Molecular Chlorine", Journal of the American Chemical Society, 2012, vol. 134, No. 49, pp. 20160-20168.

Baumgardner et al., "Confined-but-Connected Quantum Solids via Controlled Ligand Displacement", Nano Letters, 2013, vol. 13, No. 7, pp. 3225-3231.

(Continued)

*Primary Examiner* — David S Blum
(74) *Attorney, Agent, or Firm* — Michael A. McIntyre (57) ABSTRACT

Methods of treating nanocrystal and/or quantum dot devices are described. The methods include contacting the nanocrystals and/or quantum dots with a solution including metal ions and halogen ions, such that the solution displaces native ligands present on the surface of the nanocrystals and/or quantum dots via ligand exchange.

20 Claims, 4 Drawing Sheets

(56) References Cited

OTHER PUBLICATIONS

Brown et al., "Energy Level Modification in Lead Sulfide Quantum Dot Thin Films through Ligand Exchange", ACS Nano, 2014, vol. 8, No. 6, pp. 5863-5872.

Choi et al., "Steric-Hindrance-Driven Shape Transition in PbS Quantum Dots: Understanding Size-Dependent Stability", Journal of the American Chemical Society, 2013, vol. 135, No. 14, pp. 5278-5281.

Chuang et al., "Improved Performance and Stability in Quantum Dot Solar Cells Through Band Alignment Engineering", Nature Materials, 2014, vol. 13, pp. 796-801.

Crisp et al., "Metal Halide Solid-State Surface Treatment for High Efficiency PbS and PbSe QD Solar Cells", Scientific Reports, 2015, vol. 5, Article No. 9945, pp. 1-6.

Dirin et al., "Lead Halide Perovskites and Other Metal Halide Complexes As Inorganic Capping Ligands for Colloidal Nanocrystals", Journal of the American Chemical Society, 2014, vol. 136, No. 18, pp. 6550-6553.

Fafarman et al., "Thiocyanate-Capped Nanocrystal Colloids: Vibrational Reporter of Surface Chemistry and Solution-Based Route to Enhanced Coupling in Nanocrystal Solids", Journal of the American Chemical Society, 2011, vol. 133, No. 39, pp. 15753-15761.

Gao et al., "n-Type Transition Metal Oxide as a Hole Extraction Layer in PbS Quantum Dot Solar Cells", Nano Letters, 2011, vol. 11, pp. 3263-3266.

Kramer et al., "The Architecture of Colloidal Quantum Dot Solar Cells: Materials to Devices", Chemical Reviews, 2014, vol. 114, No. 1, pp. 863-882.

Kraut et al., "Semiconductor Core-Level to Valence-Band Maximum Binding-energy Differences: Precise Determination by X-ray Photoelectron Spectroscopy", Physical Review B, 1983, vol. 28, pp. 1965-1977.

IP et al., "Hybrid Passivated Colloidal Quantum Dot Solids", Nature Nanotechnology, 2012, vol. 7, pp. 577-582.

Jasieniak et al., "Size-Dependent Valence and Conduction Band-Edge Energies of Semiconductor Nanocrystals", ACS Nano, 2011, vol. 5, No. 7, pp. 5888-5902.

Jeong et al., "Enhanced Mobility-Lifetime Products in PbS Colloidal Quantum Dot Photovoltaics", ACS Nano, 2012, vol. 6, No. 1, pp. 89-99.

Luther et al., "Structural, Optical, and Electrical Properties of Self-Assembled Films of PbSe Nanocrystals Treated with 1,2-Ethanedithiol", ACS Nano, 2008, vol. 2, No. 2, pp. 271-280.

Luther et al., "Stoichiometry Control in Quantum Dots: A Viable Analog to Impurity Doping of Bulk Materials", ACS Nano, 2013, vol. 7, pp. 1845-1849.

Major et al., "A Low-cost Non-toxic Post-growth Activation Step for CdTe Solar Cells", Nature, Jul. 17, 2014, vol. 511, pp. 334-341.

Munro et al., "Photoemission Spectroscopy of Tethered CdSe Nanocrystals: Shifts in Ionization Potential and Local Vacuum Level as a Function of Nanocrystal Capping Ligand", ACS Applied Materials & Interfaces, 2010, vol. 2, No. 3, pp. 863-869.

Ning et al., "Solar Cells Based on Inks of n-Type Colloidal Quantum Dots", ACS Nano, 2014, vol. 8, No. 10, pp. 10321-10327.

Niu et al., "Inorganic Halogen Ligands in Quantum Dots: I-, Br-, Cl- and Film Fabrication Through Electrophoretic Deposition", Physical Chemistry Chemical Physics, 2013, vol. 15, No. 45, pp. 19595-19600.

Oh et al., "Designing High-Performance PbS and PbSe Nanocrystal Electronic Devices through Stepwise, Post-Synthesis, Colloidal Atomic Layer Deposition", Nano Letters, 2014, vol. 14, pp. 1559-1566.

Pietryga, "Utilizing the Lability of Lead Selenide to Produce Heterostructured Nanocrystals with Bright, Stable Infrared Emission", Journal of the American Chemical Society, 2008, vol. 130, No. 14, pp. 4879-4885.

Perkins et al., "Surfactant-assisted Growth of CdS Thin Films for Photovoltaic Applications", Journal of Vacuum Science & Technology A, 2006, vol. 24, pp. 497-504.

Pu et al., "Highly Reactive, Flexible Yet Green Se Precursor for Metal Selenide Nanocrystals: Se-Octadecene Suspension (Se-Sus)", Nano Research, 2013, vol. 6, No. 9, pp. 652-670.

Robinson et al., "Spontaneous Superlattice Formation in Nanorods Through Partial Cation Exchange", Science, Jul. 20, 2007, vol. 317, pp. 355-358.

Semonin et al., "Peak External Photocurrent Quantum Efficiency Exceeding 100% via MEG in a Quantum Dot Solar Cell", Science, Dec. 16, 2011, vol. 334, No. 6062, pp. 1530-1533.

Semonin et al., "Quantum Dots for Next-generation Photovoltaics", Materials Today, Nov. 2012, vol. 15, No. 11, pp. 508-515.

Tang et al., "Colloidal-quantum-dot Photovoltaics Using Atomic-ligand Passivation", Nature Materials, 2011, vol. 10, pp. 765-771.

Wei, "Synthesis and Optical Properties of Self-Assembled 2D Layered Organic-Inorganic Perovskites for Optoelectronics", A Thesis Submitted for the Degree of Doctor of Physics and Chemistry in the Laboratorie de photonique quantique et moléculaire, Jul. 2012, pp. 1-216.

Zhang et al., "A Generic Method for Rational Scalable Synthesis of Monodisperse Metal Sulfide Nanocrystals", Nano Letters, 2012, vol. 12, No. 11, pp. 5856-5860.

Zhang et al., "Colloidal Nanocrystals with Inorganic Halide, Pseudohalide, and Halometallate Ligands", ACS Nano, 2014, vol. 8, No. 7, pp. 7359-7369.

Zhang et al., "Diffusion-Controlled Synthesis of PbS and PbSe Quantum Dots with in Situ Halide Passivation for Quantum Dot Solar Cells", ACS Nano, 2014, vol. 8, No. 1, pp. 614-622.

Zhang et al., "PbSe Quantum Dot Solar Cells with More than 6% Efficiency Fabricated in Ambient Atmosphere", Nano Letters, Sep. 9, 2014, vol. 14, No. 10, pp. 6010-6015.

Zhitomirsky et al., "N-Type Colloidal-Quantum-Dot Solids for Photovoltaics", Advanced Materials, 2012, vol. 24, pp. 6181-6185.

Zhitomirsky et al., "Engineering Colloidal Quantum Dot Solids Within and Beyond the Mobility-invariant Regime", Nature Communications, 2014, vol. 5, Article No. 3803, pp. 1-7.

\* cited by examiner

METAL HALIDE SOLID-STATE SURFACE TREATMENT FOR NANOCRYSTAL MATERIALS

CROSS-REFERENCE TO RELATED APPLICATIONS

This application claims the benefit under 35 U.S.C. §119(e) of U.S. Provisional Patent Application No. 62/078,559, filed Nov. 12, 2014, entitled METAL HALIDE SOLID-STATE SURFACE TREATMENT FOR HIGH EFFICIENCY PBS AND PBSE QUANTUM DOT SOLAR CELLS, which is incorporated herein by reference for all purposes.

CONTRACTUAL ORIGIN

The United States Government has rights in this disclosure under Contract No. DE-AC36-08GO28308 between the United States Department of Energy and the Alliance for Sustainable Energy, LLC, the Manager and Operator of the National Renewable Energy Laboratory.

BACKGROUND

A quantum dot (QD) is a nanocrystal (NC) of a semiconductor material having a diameter that is small enough, typically on the order of a few nanometers in size, that its free charge carriers experience quantum confinement in all three dimensions. This allows QD properties (band gap, absorption spectrum, etc.) to be highly tunable, as QD size can be controlled during fabrication. As a result of this tunability, QDs are used in, or being developed for, a large number of industrial applications including solar cells, light-emitting diode (LED) displays, transistors, diode lasers, medical imaging, bioimaging, quantum computing, and QD display. Solution-processed QDs represent a promising route forward in reducing the cost of solar energy production. In addition to being solution processable, QD solar cells (QDSCs) have a higher limiting single junction power conversion efficiency than that possible using conventional bulk or thin film semiconductors due to enhanced multiple exciton generation in the QDs. Recent improvements in QDSC performance and processing have resulted from a variety of advancements in areas including modification of device architecture, processing of QD-layers under ambient conditions, improved QD synthetic procedures, and surface treatments improving QD passivation. Embodiments provided by the present disclosure represent an improvement over the state of the art and known methods of producing and treating QDs, post production. Traditional halide treatments using organic molecules may leave behind cationic organic residue that may limit QD device performance. Embodiments provided by the present disclosure provide significant and unexpected improvement upon traditional layer-by-layer approaches that use organic molecules.

SUMMARY

The present disclosure relates to the generation of QD and/or NC materials. In various aspects, the QDs and/or NCs in the materials are put into contact with a metal halide solution, with the contacting occurring after the QDs and/or NCs have been synthesized. Without wishing to be bound by any theory, it is believed that the metal halide solution displaces native ligands present in the QDs/NCs from the manufacturing process. In that respect, the native ligand is replaced with one or more of the ions present in the metal halide solution, by ligand exchange. It is also believed that the ligand exchange, and thus the removal of the native ligands, increases the stability of the QDs and/or NCs.

Therefore, in various aspects, the present disclosure provides methods of treating a nanocrystal material, the methods include contacting one or more nanocrystals with a solution containing metal ions and halogen ions, wherein one or more of the ions displaces ligands from the nanocrystals. The NCs and/or QDs do not need to be deposited on a substrate. In some embodiments, the NCs and QDs are neat and/or pure in solution. In some embodiments, the NCs and/or QDs are deposited on a substrate.

The methods disclosed herein relate to the treatment of nanocrystals generally, quantum dots being one example of a nanocrystal, and can be utilized in any method in which NCs and/or QDs are used or prepared and/or in the preparation of any device that utilizes NCs and/or QDs in any way. Non-limiting examples of QD/NC materials and applications in which the methods provided by the present disclosure can be utilized include the manufacture of devices such as light-emitting diode (LED) displays, transistors, diode lasers and solar cells. In addition, the disclosed methods may be utilized to treat QDs and/or NCs used in medical imaging, bio-imaging, quantum computing, QD display, and/or photocatalysis.

According to one embodiment, a method of making a nanocrystal device is provided. The method may include depositing a first plurality of layers of nanocrystals on a substrate. In this embodiment, each individual layer in the first plurality of layers is contacted with a metal halide solution after it has been deposited and before deposition of the next layer. The method thereafter includes depositing a second plurality of layers of nanocrystals on the first plurality of layers. As with the deposition of the first plurality of layers, each individual layer in the second plurality of layers is contacted with a solution after it has been deposited and before deposition of the next layer, however in the second plurality of layers, each individual layer is contacted with a ligand solution.

According to another embodiment, a method of manufacturing a solar cell is described. The method includes depositing a first layer of nanocrystals and/or quantum dots on a substrate, wherein the nanocrystals and/or quantum dots can be photovoltaic quantum dots, and placing the first layer of nanocrystals and/or quantum dots in contact with a metal halide solution, wherein the metal halide solution displaces oleate ligands from the first layer of nanocrystals and/or quantum dots.

According to another embodiment, a method of making a solar cell is described. The method includes depositing a first plurality of layers of quantum dots on a substrate. In this embodiment, each individual layer in the first plurality of layers is contacted with a metal halide solution after it has been deposited and before deposition of the next layer. The method thereafter includes depositing a second plurality of layers of quantum dots on the first plurality of layers. As with the deposition of the first plurality of layers, each individual layer in the second plurality of layers is contacted with a solution after it has been deposited and before deposition of the next layer, however in the second plurality of layers, each individual layer is contacted with a ligand solution.

DETAILED DESCRIPTION

Reference is now made to certain embodiments of metal ion and halogen ion solid-state surface treatment for high efficiency nanocrystal devices. The present disclosure relates to treatment of nanocrystals generally which, in some embodiments, can be quantum dot nanocrystals. A quantum dot is a type of nanocrystal that experiences quantum confinement effects. By way of example, not limitation, a 10 nm silicon nanocrystal may not display quantum confinement effects, or may display negligible quantum confinement. However, such a nanocrystal may still have surface ligands that may limit or otherwise impact performance. The methods provided by the present disclosure can be used to treat such a nanocrystal and replace the native surface ligands with other ions via ligand exchange, as disclosed herein. In that respect, the methods provided by the present disclosure are not limited to use with quantum dots; rather, any nanocrystal containing one or more surface ligands may be treated as described herein.

As used herein, the terms "nanocrystal" and "quantum dot" and the acronyms "NC" and "QD" refer to any elemental or compound semiconductor, metal, or metal oxide nanocrystal material with dimensions from about 1 nm to about 100 nm, or in some embodiments from about 3 to about 20 nm. In some embodiments, the material includes one or more metal chalcogenides selected from PbS, PbSe, PbTe, CdSe, CdS, CdTe, CuInS, CuInSe, ZnS, ZnSe, ZnTe, HgTe, CdHgTe and combinations of any of the foregoing. In some embodiments, the material may be one or more IUPAC Group III-V materials selected from InP, InAs, GaAs Si, Ge, SiGe, Sn and combinations thereof. In some embodiments, the material is selected from ZnO, MoO, TiO2, other metal oxides and combinations thereof. In some embodiments, the material may include one or more perovskite nanocrystals selected from CsPbBr3, CsPbI3, CsPbCl3, CsSnI3, organic inorganic perovskite like structures existing in colloidal nanocrystal form, and combinations of any of the foregoing. The disclosed embodiments are not intended to be limiting of the claims. To the contrary, the claims are intended to cover all alternatives, modifications, and equivalents. The concepts described herein are intended to be broader than the particular context in which they are presented. For example, though certain embodiments are presented in the context PbS and PbSe quantum dot devices, such disclosure is provided merely for the sake of simplicity; the novel methods of treatment may be employed in related contexts in which treatment of any nanocrystal and/or quantum dot material(s) to replace native ligands is desired. Various examples include treatment of nanocrystals and/or quantum dots with a solution containing one or more metal ions and one or more halogen ions, and/or with a metal halide solution, for the manufacture of devices such as light-emitting diode (LED) displays, transistors, diode lasers and solar cells and for use in medical imaging, bioimaging, quantum computing, NC and/or QD display and photocatalysis.

In various aspects, the present disclosure relates to the replacement of native ligands present on the surface of a NC and/or QD material or in a solution that includes the NCs and/or QDs. In some embodiments, the ligands are artifacts, or by-products, of the NC or QD production process. In some embodiments, the ligands are present because of one or more post-production processing steps. The disclosed methods may be used to replace any native ligand. In some embodiments, the native ligand is a long chain fatty acid. In some embodiments, the native ligands are selected from oleic acid (oleate ligands), oleylamine, dodecylamine, pyridine, decylamine, octylamine, dodecanethiol, octadecanethiol, octadecylphosphonic acid, trioctylphosphonic acid, and combinations of any of the foregoing. In some embodiments, the native ligands are lead oleate ligands. In general, native ligands may be an organic ligand.

Embodiments provided by the present disclosure represent an improvement over the state of the art and known methods of producing and treating NDs and/or QDs. In some embodiments, the treatment can occur post production. Traditional halide treatments using organic molecules may leave behind cationic organic residue that may limit ND and/or QD device performance. Embodiments provided by the present disclosure provide significant and unexpected improvement upon traditional layer-by-layer and other approaches that use organic molecules.

In various aspects, the present disclosure provides the use of metal ions and halogen ions, and/or metal halides, dissolved in a solvent as a post-production treatment of NCs and/or QDs. In some embodiments, the metal ions and halogen ions, and/or the metal halides, are used to treat NCs and/or QDs in order to build-up thick, all-inorganic films by, for example, dip coating, spin coating, curtain coating, blade coating, spraying, or any other suitable solution based, non-vapor phase coating method.

In some embodiments, methods provided by the present disclosure utilize a metal halide solution in order to treat the NCs and/or QDs. Metal halides are binary compound salts that can be generally described via the formula $MX_y$, where M is a metal, X is a halogen and y is an integer selected from 1, 2 and 3. In solution, metal halides dissociate into metal ions and halogen ions.

In some embodiments, methods provided by the present disclosure utilize a solution having metal ions and halogen ions. In that respect, the sources of metal ions and halogen ions in the solution do not necessarily need to come from a metal halide salt. Rather, the metal ions and the halogen ions may be contributed to the solution by any means. In some embodiments, a metal salt may be used to contribute metal ions to the solution and a halogen salt may be used to contribute halogen ions to the solution. In some embodiments, a metal halide salt contributes metal ions and halogen ions to the solution.

As used herein, a "metal" is a material that forms a cation through electron loss. In various aspects, the metal ions present in the solution, whether from use of a metal halide or any other metal source, can be from any metal. In some embodiments, the metal is selected from an alkali metal, an alkaline Earth metal, a transition metal, a post-transition metal, a lanthanide metal and an actinide metal. In some embodiments, the metal is selected from lithium, sodium, potassium, rubidium, caesium, francium, beryllium, magnesium, calcium, strontium, barium, radium, scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, dubnium, seaborgium, bohrium, hassium, copernicium, aluminium, gallium, indium, tin, thallium, lead, bismuth, polonium, flerovium, lanthanum, cerium, praseodymium, neodymium, promethium, samarium, europium, gadolinium, terbium, dysprosium, holmium, erbium, thulium, ytterbium, lutetium, actinium, thorium, protactinium, uranium, neptunium, plutonium, americium, curium, berkelium, californium, einsteinium, fermium, mendelevium, nobelium and lawrencium. In some embodiments, the metal is lead.

As used herein, a "halogen" is a member of the chemically related elements that form Group 17 of the IUPAC periodic table of the elements. In various aspects, the halogen ions present in the solution, whether from use of a metal halide or any other halogen source, can be from any halogen. In some embodiments, the halogen is selected from fluorine, chlorine, bromine, iodine and astatine. In some embodiments, the halogen is iodine. In some embodiments, the metal is lead, the halogen is iodine and the solution includes lead ions and iodide ions. In some embodiments of a binary metal halide $MX_y$, the metal is lead, the halogen is iodine, y is 2 and the solution having lead ions and iodide ions.

The solvent used to dissolve the metal halide, thereby placing it into solution, can vary. In some embodiments, the solvent is a polar protic solvent containing an acidic hydrogen. In some embodiments, the solvent is a polar aprotic solvent lacking an acidic hydrogen. In some embodiments, the solvent is non-polar. In some embodiments, the solvent is an alcohol. In some embodiments, the solvent is selected from tetrahydrofuran, ethyl acetate, acetone, dimethylformamide, acetonitrile, dimethyl sulfoxide, nitromethane, propylene carbonate and combinations thereof. In some embodiments, the solvent is selected from formic acid, butanol, n-butanol, isopropanol, n-propanol, ethanol, methanol, acetic acid, water and combinations thereof. In some embodiments, the solvent is selected from pentane, cyclopentane, hexane, cyclohexane, carbon tetrachloride, benzene, toluene, 1,4-dioxane, chloroform, diethyl ether, dichloromethane and combinations thereof. In some embodiments, the solvent is dimethylformamide.

The solution described above and provided by the present disclosure, may introduce ions (e.g., $Cl^-$ or $I^-$) which may passivate NC and/or QD trap states, thereby reducing the probability of non-radiative recombination of charge carriers and increasing the quantum yield of charge carriers. These and other advantages will be described in more detail below.

Without limiting the generality of the foregoing, certain specific embodiments provided by the present disclosure will now be described. Various embodiments disclosed herein use PbS and PbSe QDs. PbS and PbSe QDs may be made, for example, by cation exchange of CdS and CdSe QDs, respectively, with $PbCl_2$/oleylamine. For PbSe QDs, CdSe precursors may be synthesized to obtain ~5 nm, monodisperse CdSe. The CdSe precursors may then be chemically converted to PbSe through a cation exchange reaction by mixing about 0.834 g $PbCl_2$ with 10 mL oleylamine (OLA), degassing, and heating to about 140° C. for about 30 min. The mixture may be heated to ~190° C. and 2 mL of CdSe (100 mg/mL, in octadecene) may be injected. The reaction may be left at ~180° C. for 30 seconds then quenched with a water bath. As the reaction cools, 10 mL hexane and 8 mL oleic acid (OA) may be injected at ~70° C. and ~30° C., respectively. The reaction may be allowed to cool and washed by precipitation-redispersion with ethanol and hexane. The final dispersion may be centrifuged to remove any excess chloride salts and filtered through a 0.2 µm filter.

PbS may be synthesized by the cation exchange of CdS precursors. The cation exchange follows that of the CdSe, except the CdS precursors are cooled to about 90° C. before the injection of CdS (150 mg/mL in toluene) and the reaction runs for about 60 seconds. The product may be washed and filtered in the same way as described above.

Figure 1:
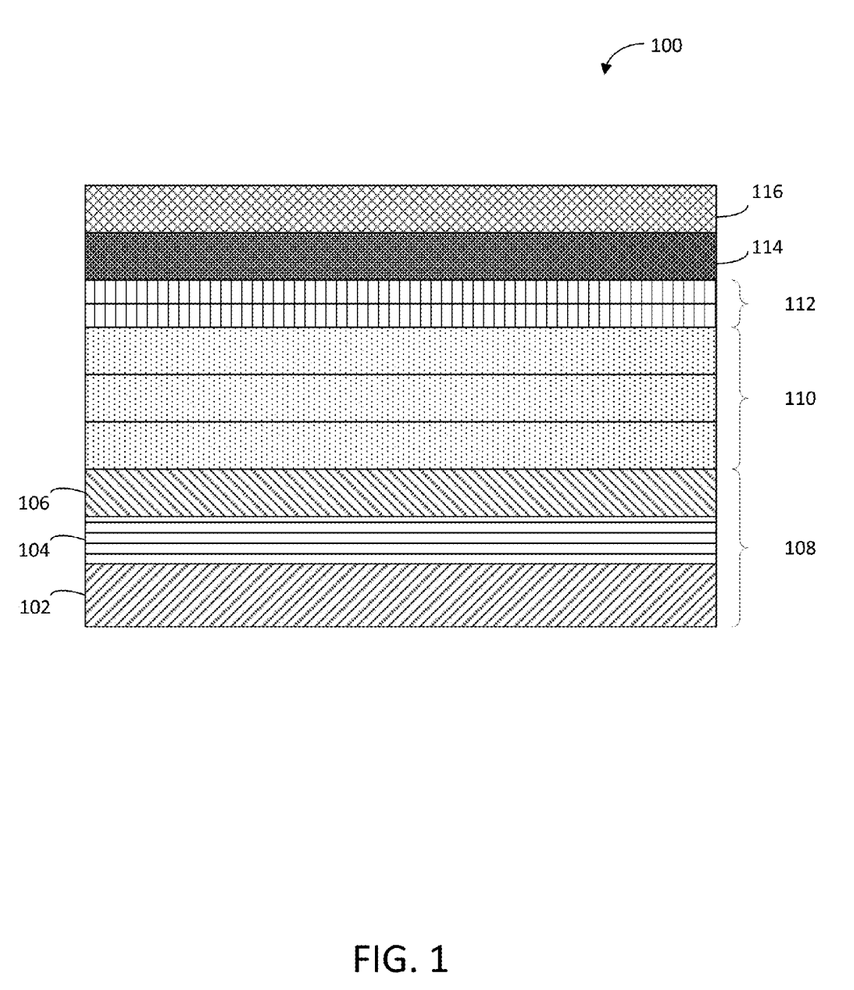
FIG. 1 is a cross-section of a quantum dot solar cell, in accordance with embodiments provided by the present disclosure.

FIG. 1 is a cross-section of a QD material, a solar cell in the depicted embodiment, generally designated 100, that may be produced by the methods provided by the present disclosure. The QD solar cell 100 may include a substrate 108, one or more QD layers 110, each of which may be treated with a solution having metal ions and halogen ions during solution-phase ligand exchange, one or more optional, additional QD layers 112, a Molybdenum oxide (MoOx) layer 114, and an aluminum (Al) contact layer 116. The MoOx layer 114 and Al contact layer 116 may be collectively referred to herein as a MoOx/Al back contact. The substrate 108 may include a glass layer 102, an indium-tin-oxide (ITO) layer 104, and a $TiO_2$ layer 106. The ITO layer 104 may be a patterned ITO layer. Although titanium dioxide ($TiO_2$) substrates are discussed throughout this Detailed Description, such discussion is for brevity. Titanium dioxide is merely an example of a substrate layer; other substrate materials and combinations of materials are also contemplated (see Table 2). One or more QD layers 110 may be deposited on the substrate 108. In some embodiments, the one or more QD layers 110 may include PbS and/or PbSe quantum dots. In some embodiments, each QD layer 110 may be treated—placed in contact with—a solution containing metal ions and halogen ions after deposition, and prior to deposition of the next QD layer 110, during solution-phase ligand treatment. One or more additional QD layers 112 may optionally be deposited onto the QD layers 110. The additional QD layers may create a bi layer structure. A bilayer (or more complex) structure may improve various electrical properties including, for example, current density-voltage characteristics. The deposition of the QD layers 110 and the optional additional QD layers 112 is described in further detail with respect to FIG. 2.

Figure 2:
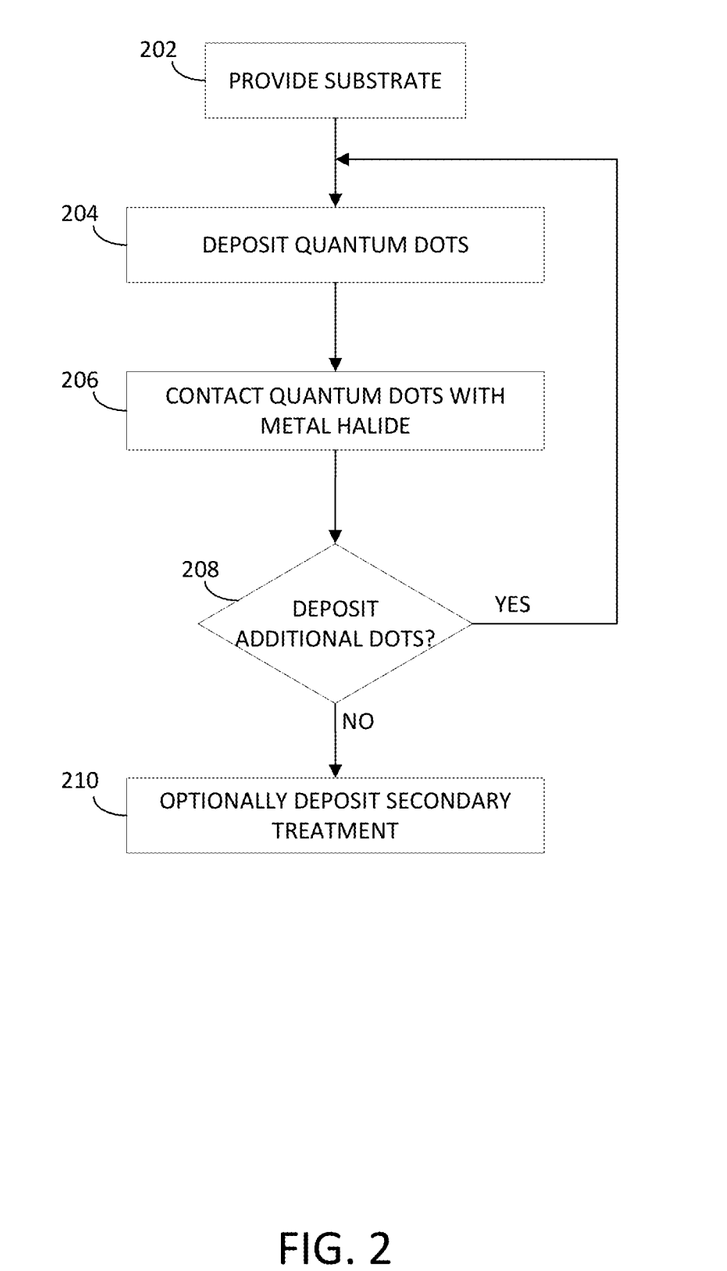
FIG. 2 is a flowchart illustrating a method of making a nanocrystal device, in accordance with embodiments provided by the present disclosure. In the depicted embodiment, the nanocrystals are quantum dots.

FIG. 2 is a flowchart illustrating a method of making a QD material, in accordance with embodiments provided by the present disclosure. In step 202, a substrate is provided (e.g., substrate 108). As described above, the substrate 108 may include the glass layer 102, the ITO layer 104, and the $TiO_2$ layer 106. The $TiO_2$ layer 106 may be deposited on the ITO layer 106 with a sol-gel method, for example. $TiO_2$ sol-gel may be prepared, for example, by mixing about 5 mL anhydrous ethanol, about 2 drops hydrochloric acid, and about 125 µL deionized water. This mixture may be stirred while about 375 µL titanium ethoxide is added drop-wise such that no precipitates form. This may yield a clear liquid that may be stirred for about 48 hours with the headspace of the vial filled with nitrogen. The resulting mixture may be stored in a freezer until needed. The ITO/glass substrates may be cleaned with ethanol and UV-ozone treated before depositing $TiO_2$. Within 10 min of UV-ozone treatment, about 70 µL $TiO_2$ sol-gel may be spun at 1400 RPM for about 30 seconds. The $TiO_2$ may be wiped off the ITO contact pads using ethanol and the films may be dried at about 115° C. then annealed at about 450° C. for about 30 minutes. The films may be stored in air and sit in air for at least one day before use.

In step 204, QDs are deposited. The QDs may be deposited in any manner. In some embodiments, the QDs are deposited as a layer (e.g., one of the QD layers 110). The QDs may be deposited on the substrate 202 or on previously deposited QDs (for example, where a plurality of QD layers 110 are deposited). The manner in which the QDs are deposited can vary. In some embodiments, the QDs are deposited by a method selected from dip coating, spin coating, curtain coating, blade coating, spraying and any other suitable method that is not a vapor phase method. For dip coating, the substrate 108, 202 may be immersed into a ~15 mg/mL solution of QDs in a solvent such as hexane and smoothly removed, resulting in a thin film of QDs along a surface of the substrate. Other dip coating procedures may also be used instead of or in addition to those discussed above. For spin coating, the QDs may be dispersed in a solvent such as octane at a concentration of about 40 mg/mL and spun at about 1000 rpm for about 45 seconds. Other spin coating procedures may also be used instead of or in addition to those discussed above. The exact concentration, speed, and time of coating may depend on various factors including, but not limited to, the area of the substrate, the desired thickness of the layer and the nature of the QD material to be prepared.

In step 206, the QDs deposited in step 204 are treated with a solution containing metal ions and halogen ions. For example, in some embodiments a QD layer, such as layer 110, may be dipped into a 10 mM metal halide solution for about 30 seconds to about 60 seconds, rendering the QD layer 110 insoluble in hexane and allowing for thick films to be built up layer by layer. As used herein, the term "layer" means a coating of QDs on a substrate which, in some embodiments, may be a monolayer of QDs. In some embodiments, dimethylformamide is used as the solvent for the metal halide. In such instances, a post-ligand treatment with neat acetonitrile may be used to remove residual dimethylformamide that may not dry rapidly. It should be noted that some of the metals and/or halogen combinations (metal halide or otherwise) disclosed herein may not be appreciably soluble in acetonitrile. In such instances, a mixture of about 20 vol % dimethylformamide/acetonitrile can be used to solvate the metal/halogen and QD devices treated in this fashion may perform as well as those with the metal/halogen combination dissolved in dimethylformamide only for the ligand treatment solvent. For spin coating, the QDs may be immersed in ~10 mM metal halide solution for about 3 minutes and rinsed with acetonitrile. These steps may be performed in an order other than that presented in FIG. 2. For example, the QDs may be treated in solution (as opposed to being deposited on a substrate, as noted above) with a metal halide salt prior to deposition of the QD layer. Other methods of treating the QDs with the solution containing metal ions and halogen ions are also contemplated. In some embodiments, the metal/halogen treatment may result in a thin layer of metal forming on the surface of the QD layer.

Figure 4:
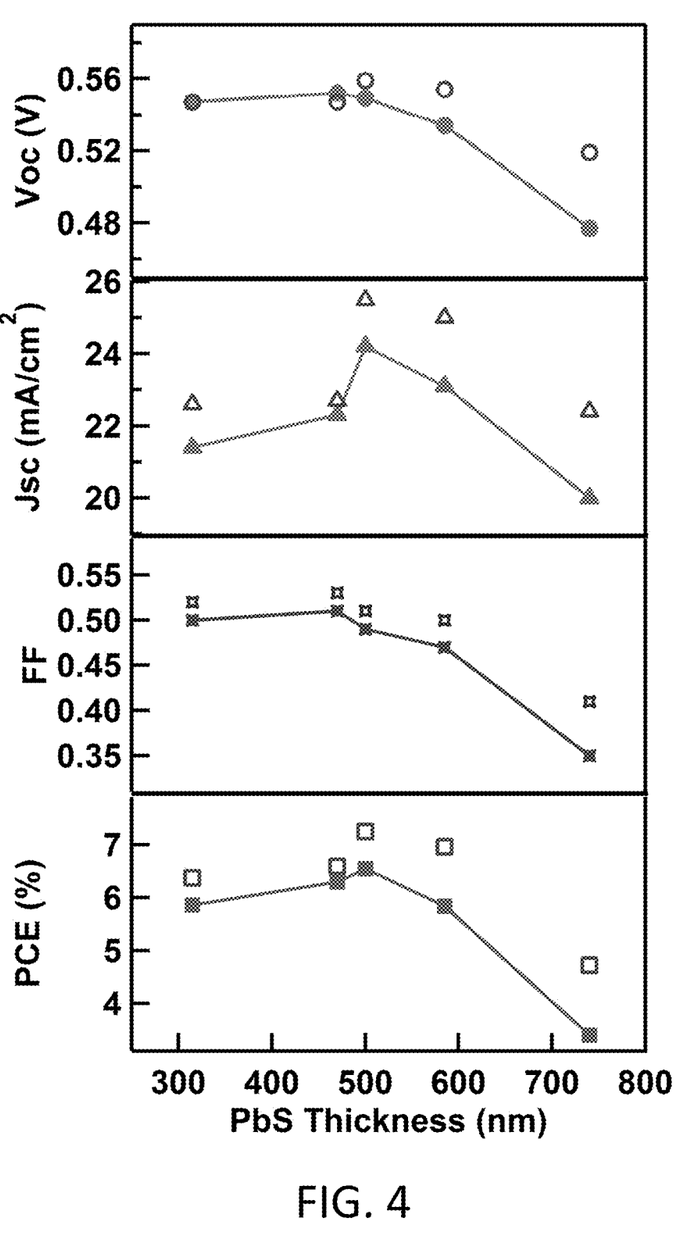
FIG. 4 is a graph depicting the open-circuit voltage ($V_{oc}$), short-circuit current ($J_{sc}$), fill factor (FF), and power conversion efficiency (PCE) plotted as a function of quantum dot layer thickness.

In decision block 208, a determination may be made whether to add additional QDs on top of those that have already been deposited, after treatment with the solution. Both dip coating and spin coating QDs may allow for a controlled thickness of QDs with appropriate surface coverage. For example, in some embodiments with increasing number of dip cycles into 10 mM metal halide ($PbI_2$) in dimethylformamide an increase in absorption (A=100-T-R) of PbS QD films may be produced while preserving the first exciton feature related to the QD size. FIG. 4, discussed in further detail below, demonstrates some of the various effects of different thicknesses of the QD layer 110. Such effects may include changes in the open-circuit voltage ($V_{oc}$), short-circuit current ($J_{sc}$), fill factor (FF), and power conversion efficiency (PCE). If additional QDs are to be added (decision block 208, YES branch), they may be sequentially deposited onto the QDs previously deposited (as in step 202) and treated with the solution (as in step 204) prior to deposition of additional QDs. In various embodiments, dip coated devices may include from about 10 to about 15 layers of metal/halogen-treated QDs. Spin coated devices may include any number of QD layers 110.

If additional metal/halogen treated QDs are not to be added (decision block 208, NO branch), a secondary treatment 210 may then be applied to the QD device. In some embodiments, the secondary treatment 210 is the deposition of additional QDs, (e.g., additional QD layers 112) on the QDs that had already been deposited (e.g., one or more QD layers 110) and treated with the solution. A unique feature of QD solids is the ability to control the absolute energy levels by applying different ligands. This effect may be the result of ligand-induced surface dipoles. Such control allows the energetics within a device to be engineered by using multiple surface treatments during the QD deposition to create bilayer (or more complex) structures of QD solids. For example, increased performance in PbSe solar cells may result from employing ethanedithiol (EDT) and hydrazine layers. $PbS_{TBAI}/PbS_{EDT}$ and $PbS_{TMAOH}/PbS_{TBAI}$ combinations (where TMAOH is tetramethylammonium hydroxide) may be used to enhance carrier collection resulting in improved device performance. For example, in embodiments employing dip coating, the one or more QD layers 110 may be followed by 3 to 4 additional QD layers 112 (although greater or fewer layers may be used). Each of the additional QD layers 112 may be treated with a different ligand treatment than the metal/halogen ion solution prior to the deposition of a subsequent layer. For example, in some embodiments, the additional QD layers 112 may be treated with an MPA (methiopropamine) solution, such as ~10% MPA in methanol (MeOH) or a thiocyantate (SCN) solution, such as ~10 mM SCN solution in MeOH. In embodiments employing spin coating, the one or more QD layers 110 may be coated with about 2 layers of MPA-capped additional QD layers 112. The last two layers of QDs may be treated with ~10% MPA in MeOH by dipping the device into a MPA/MeOH solution, rinsing twice with MeOH and drying with nitrogen. In some embodiments, the MPA/MeOH treated QD devices function more efficiently than the SCN treated QD devices. A MoOx/Al back contact may then be thermally evaporated onto the last additional QD layer 112, in order to generate a QD solar cell.

Figure 3:
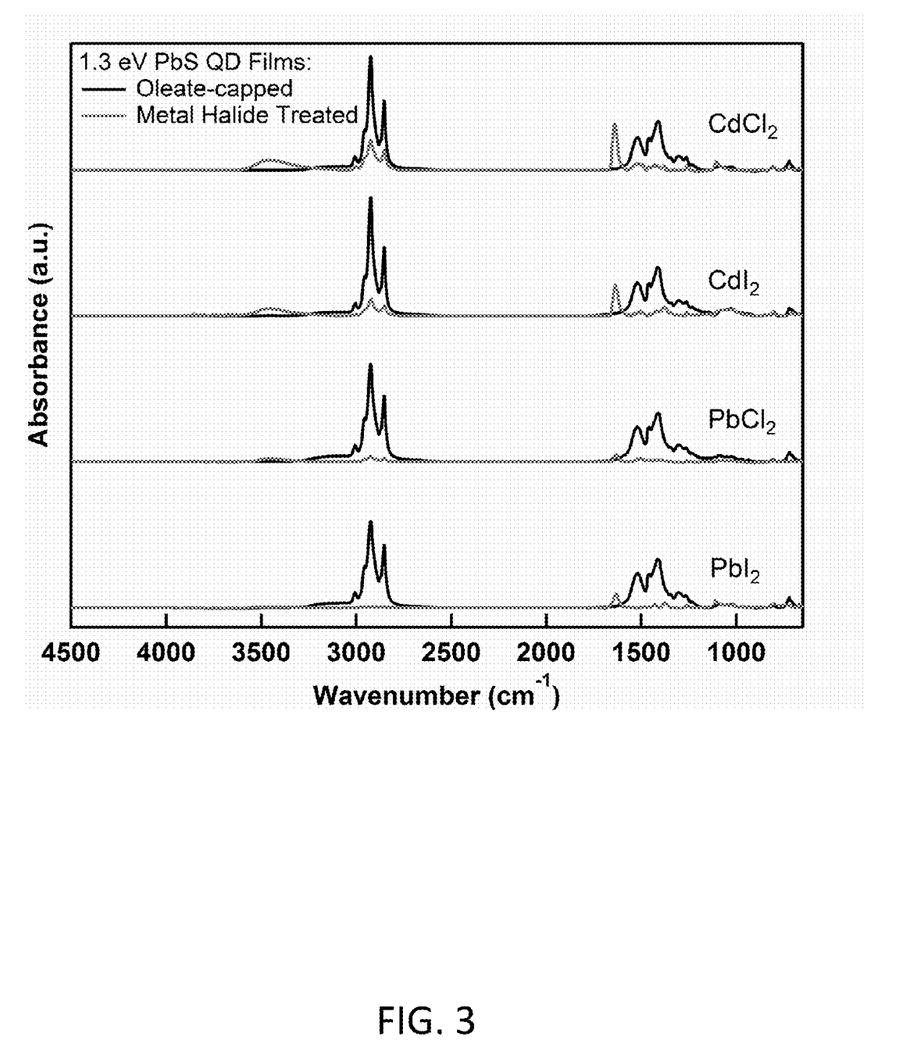
FIG. 3 is a graph depicting Fourier-Transform Infrared spectra of films capped with the native oleate ligand and corresponding spectra after ligand treatment with the metal halide salts.

As discussed above, treatment of the QD layers 110 with the metal/halogen ion containing solution replaces native ligands in QD layers. FIG. 3 is a graph depicting baseline-corrected Fourier-Transform Infrared spectra of dropcast QD films capped with a native oleate ligand and the corresponding spectra after ligand treatment with a metal halide solution of lead iodide in dimethylformamide. Based on the ratios of the largest absorbance feature at 2925 cm$^{-1}$ (corresponding to the $v_a$(—$CH_2$) mode), it is clear that iodide salts remove more lead-oleate than chloride salts (i.e., $CdI_2$ removes more than $CdCl_2$), and the lead salts also remove more lead-oleate than the cadmium salts (i.e., $PbI_2$ is more effective than $CdI_2$). This trend is deduced using a ratio of the absorbance at 2925 cm$^{-1}$, i.e. [post-soak]/[pre-metal halide soak]. In the embodiment depicted in FIG. 3, about 26% oleate remains after treatment with $CdCl_2$, about 14% oleate remains after $CdI_2$ treatment, about 5.1% oleate remains after $PbCl_2$ treatment, and about 1.4% oleate remains after $PbI_2$ treatment. Some residual organics may be from dimethylformamide still present after rinsing with SCN, as indicated by the peak near 1640 cm$^{-1}$.

To further detail the composition and properties of QD materials, which was a solar cell in this embodiment, treated with $PbI_2$ ($PbS_{PbI2}$), comparison of the atomic concentrations and energy levels using x-ray photoelectron spectroscopy (XPS) to other ligand-exchanged QD films were made, as shown in Table 1. QD films using iodine-containing ligands (i.e., TBAI and PbI$_2$), as well as the sulfur-containing ligands (i.e., MPA and ammonium thiocyanate (NH$_4$SCN)), were compared. Both NH$_4$SCN and MPA have carbon signatures greater than 20 mol %. Comparing QD films treated with TBAI to those treated with PbI$_2$, the percentage of carbon present in the film was greatly reduced (from about 26.7 mol % to about 2.5 mol %) when using the PbI$_2$ treatment. The MPA and NH$_4$SCN may not displace the Cl present in the QDs (Cl added during the ion exchange reaction via PbCl$_2$/oleylamine), whereas after treating QD films with TBAI or PbI$_2$, Cl was not detected by XPS.

used to fabricate PbSe QD materials under ambient conditions (PbSe is generally more prone to oxidation than PbS). Ambient conditions can be, for example: IUPAC established standard temperature and pressure, which is a temperature of 273.15 K (0° C., 32° F.) and an absolute pressure of exactly 100,000 Pa (1 bar, 14.5 psi, 0.98692 atm); or SATP conditions, which are a temperature of 298.15 K (25° C., 77° F.) and an absolute pressure of exactly 1 atm (101,325 Pa, 1.01325 bar); although the known standards adopted by the International Organization for Standardization (ISO), the United States Environmental Protection Agency (EPA) and National Institute of Standards and Technology (NIST) may also be used. The disclosed embodiments may thus be practiced at a variety of temperatures and pressures. In some examples, the

TABLE 1

Relative atomic percentage of elements in ligand-exchanged QD films determined by XPS

| Treatment | C | N | I | Cl | Pb | S | O | Cd | Pb:S | Pb:I | Pb:Cl | Pb:(S + I): | Pb:(S + Cl) |
|---|---|---|---|---|---|---|---|---|---|---|---|---|---|
| PbI$_2$ | 2.5 | * | 26.9 | * | 45.7 | 19.3 | 5.3 | 0.3 | 2.4 | 1.7 | | 1.0 | |
| TBAI | 26.7 | 1.3 | 19.2 | * | 34.3 | 16.4 | 1.7 | 0.4 | 2.1 | 1.8 | | 1.0 | |
| MPA | 27.3 | * | * | 7.0 | 28.4 | 19.7 | 16.6 | 1.0 | 1.4 | | 4.1 | | 1.1 |
| NH$_4$SCN | 21.0 | 2.9 | * | 4.0 | 37.8 | 27.3 | 7.0 | 0.2 | 1.4 | | 9.5 | | 1.2 |

*values below detection limit

The stoichiometry in ionic QDs may be related to majority carrier type in the film. For instance, the Pb:anion ratio may decrease with the addition of chalcogens from ligands like MPA or NH$_4$SCN resulting in p-type QD films. Such a change in the stoichiometry may then also change the Fermi level position within the bandgap. The XPS spectra may be used to determine the work function ($\Phi$=difference between Fermi energy and vacuum level) and the onset of VB states relative to the Fermi energy ($E_F$-$E_{VB\ onset}$).

Treating the QDs with MPA or NH$_4$SCN may decrease the separation between the onset of the valence band (VB) states and the Fermi level. The I$^-$ treatments may lead to deeper VB states (i.e., larger energy difference between vacuum and the VB onset) and are more n-type then the sulfur-containing ligand treatments. It should be noted that both I-treated films have Pb:(S+I) ratios of unity. The lower Pb:S ratios for the MPA and NH$_4$SCN treatments compared to the I$^-$ ligand treatment support the conclusion that the MPA and NH$_4$SCN treatments lead to more p-type films than the I$^-$ ligand treatments. The ligand may dictate the Fermi level position within the bandgap and may control the overall band positions relative to vacuum. Embodiments described herein unexpectedly show that the PbI$_2$ ligand exchanged PbS QD film has the lowest lying VB onset and $\Phi$ of all of the ligands described herein. Thus, the pretreatment methods utilizing metals and halogens dissolved in a solvent described herein may provide control of both the band positions and majority carrier type within QD solids, thus enabling the deliberate engineering of the energetics within a device, in a way that was previously unavailable.

According to certain embodiments, the QD layers may remain distinct with likely different material density or perhaps conductivity. In various embodiments, devices fabricated using CdCl$_2$ have an improved V$_{oc}$ over those fabricated from PbI$_2$-treated QDs and reach a power conversion efficiency of about 5.6%. The spectral response of a CdCl$_2$-treated device may exhibit a 100-nm blue shift in the wavelength of the first exciton feature that may be due to a surface ion exchange which reduces the size of the PbS core and increases the bandgap. Metal halide treatments may also be methods described herein may be performed in an inert environment (e.g. argon, helium, nitrogen) or the methods may be performed in an oxygen containing environment (e.g. air). In some embodiments, the methods described herein may be performed at about room temperature (e.g. about 21° C.). In other embodiments, the methods described herein may be performed at a temperature of about 0° C. to about 100° C.

EXAMPLES

The thickness dependence of a PbS absorber layer was tested by producing devices composed of 4, 6, 7, 8, and 10 sequential spin coating steps according to the methods described above with respect to FIGS. 1 and 2. After each spin, the film was treated by soaking in PbI$_2$ in dimethylformamide for about 3 minutes. The last two coatings were treated by MPA rather than PbI$_2$. FIG. 4 is a graph depicting the open-circuit voltage (V$_{oc}$), short-circuit current (J$_{sc}$), fill factor (FF), and PCE, plotted as a function of QD layer thickness for each of the produced devices. The solid symbols represent the average of 6 devices and the hollow symbols represent the best performing device for each film thickness. The best device reached a PCE of about 7.25% which corresponds to a thickness of about 500 nm. The EQE response of the devices generally increased spectral response for lower energy photons (i.e. photons with wavelength between 600 and 1200 nm). The internal quantum efficiency (IQE) also increased in this same manner with the thickest cell showing a flat response of about 80% to about 85%. For the device with a PbS QD thickness of about 740 nm, the IQE was determined to be roughly 80% for all photons absorbed in the QD layer (i.e. photon energy above the bandgap of the PbS QDs and below the absorption of the glass/ITO substrate). Electron transport was sufficient to extract ~80% of carriers generated in the device, indicated by the IQE and flat spectrum, despite being significantly thicker than the current world record PbS QDSC. Therefore, the metal halide treatments described herein, and the PbI$_2$ in particular, are very promising for improving the overall efficiency of QD materials. Table 2 shows details of several QD materials, in this case solar cells, made in accordance with various methods described herein.

TABLE 2

Compilation of the various device parameters explored.

| QDs | n-type contact | Ligand/solvent | Back surface ligand | Deposition method | PbE thickness | Voc (mV) | Jsc (mA/cm²) | FF (%) | PCE (%) | Meas. env. |
|---|---|---|---|---|---|---|---|---|---|---|
| PbSe (CdSe) | TiO₂ | PbI₂/DMF | MPA (10%) | Dipcoat | 300 nm | 428 | 22.7 | 54.8 | 5.3 | N₂ |
| PbS (CdS) | CdS | PbI₂/DMF | MPA (10%) | Dipcoat | ~350 nm | 543 | 16.5 | 45.0 | 4.0 | Air |
| PbS (CdS) | TiO₂ | PbI₂/DMF:ACN 1:5 | EDT (1 mM) | Dipcoat | ~300 nm | 623 | 14.2 | 36.2 | 3.2 | Air |
| PbS (CdS) | In:ZnO sol-gel | PbI₂/DMF:ACN 1:5 | EDT (1 mM) | Dipcoat | ~550 nm | 567 | 17.4 | 42.8 | 4.2 | Ar |
| PbS (CdS) | ZnO NCs | PbI₂/DMF:ACN 1:5 | EDT (1 mM) | Spincoat | ~500 nm | 606 | 20.5 | 34.0 | 4.2 | Air |
| PbS (CdS) | TiO₂ | PbI₂/DMF:ACN 1:5 | MPA (10%) | Dipcoat | 550 nm | 597 | 21.8 | 45.0 | 5.9 | Air |
| PbS (CdS) | TiO₂ | MPA | N/A | Dipcoat | ~400 nm | 542 | 6.96 | 47.1 | 1.8 | Air |
| PbS (CdS) | TiO₂ | EDT | N/A | Dipcoat | ~550 nm | 596 | 15.8 | 33.8 | 3.2 | Air |
| PbS (CdS) | TiO₂ | PbI₂/DMF | MPA (10%) | Dipcoat | 350 nm | 584 | 25.3 | 44.8 | 6.6 | Air |
| PbS (CdS) | TiO₂ | PbI₂/DMF | MPA (2%) | Spincoat | ~420 nm | 496 | 23.0 | 43.2 | 4.9 | N₂ |
| PbS (CdS) | TiO₂ | PbI₂/DMF:ACN 1:5 | Na₂S (10 mM) | Dipcoat | ~400 nm | 513 | 11.9 | 19.9 | 1.2 | N₂ |
| PbS (CdS) | TiO₂ | PbI₂/DMF:ACN 1:5 | NH₄SCN (10 mM) | Dipcoat | 340 nm | 500 | 16.6 | 33.2 | 2.8 | N₂ |
| PbS (CdS) | TiO₂ | PbI₂/DMF:ACN 1:5 | MPA (10%) | Dipcoat | 750 nm | 516 | 14.1 | 48.6 | 3.5 | N₂ |
| PbS (PbCl₂) | TiO₂ | PbI₂/DMF | MPA (10%) | Spincoat | ~550 nm | 476 | 22.8 | 42.3 | 4.6 | N₂ |
| PbS (PbCl₂) | TiO₂ | PbI₂/DMF | MPA (10%) | Spincoat | ~300 nm | 466 | 21.2 | 40.4 | 4.0 | N₂ |
| PbS (PbCl₂) | TiO₂ | PbI₂/DMF | MPA (10%) | Spincoat | ~300 nm | 348 | 18.8 | 30.6 | 2.0 | N₂ |
| PbS (CdS) | TiO₂ | PbI₂/DMF | N/A | Spincoat | ~500 nm | 412 | 11.8 | 18.9 | 0.9 | N₂ |
| PbS (CdS) | TiO₂ | PbI₂/DMF | MPA (10%) - dip | Spincoat | ~500 nm | 431 | 19.5 | 30.5 | 2.6 | N₂ |
| PbS (CdS) | TiO₂ | PbI₂/DMF | MPA (10%) | Spincoat | ~500 nm | 438 | 23.9 | 47.5 | 5.0 | N₂ |
| PbS (CdS) | TiO₂ | PbI₂/DMF | MPA (10%) | Spincoat | 330 nm | 547 | 22.6 | 52.0 | 6.4 | N₂ |
| PbS (CdS) | TiO₂ | PbI₂/DMF | MPA (10%) | Spincoat | 500 nm | 547 | 22.7 | 53.0 | 6.6 | N₂ |
| PbS (CdS) | TiO₂ | PbI₂/DMF | MPA (10%) | Spincoat | 580 nm | 559 | 25.5 | 51.0 | 7.3 | N₂ |
| PbS (CdS) | TiO₂ | PbI₂/DMF | MPA (10%) | Spincoat | 660 nm | 554 | 25.0 | 50.0 | 7.0 | N₂ |
| PbS (CdS) | TiO₂ | PbI₂/DMF | MPA (10%) | Spincoat | 830 nm | 519 | 22.4 | 41.0 | 4.7 | N₂ |
| PbS (CdS) | TiO₂ | PbCl₂/DMF | MPA (10%) | Spincoat | 580 nm | 354 | 4.66 | 41.0 | 0.7 | N₂ |
| PbS (CdS) | TiO₂ | CdI₂/DMF | MPA (10%) | Spincoat | 580 nm | 421 | 21.2 | 42.1 | 3.8 | N₂ |
| PbS (CdS) | TiO₂ | CdCl₂/DMF | MPA (10%) | Spincoat | 580 nm | 620 | 19.9 | 45.1 | 5.6 | N₂ |

What is claimed is:

1. A method of treating a quantum dot material, comprising:
contacting a first layer of quantum dots with a solution comprising metal ions and halogen ions dissolved in a polar aprotic solvent, wherein the ions in the solution displace native ligands from the quantum dots.

2. The method of claim 1, further comprising:
depositing a second layer of quantum dots on the first layer; and
contacting the second layer with a ligand solution.

3. The method of claim 1, wherein the metal ions and the halogen ions are provided by at least one metal halide.

4. The method of claim 3, wherein the metal halide comprises at least one of PbCl₂, PbI₂, CdCl₂, or CdI₂.

5. The method of claim 1, wherein the polar aprotic solvent is dimethylformamide.

6. The method of claim 1, wherein the contacting is performed at about room temperature in an oxygen containing environment.

7. The method of claim 1, wherein the quantum dots comprise at least one of PbS or PbSe.

8. The method of claim 1, further comprising:
depositing a second layer of quantum dots on the first layer;
contacting the second layer with the solution;
depositing a third layer of quantum dots on the second layer; and
contacting the third layer of quantum dots with a ligand solution.

9. A method of making a quantum dot device, comprising:
depositing a first plurality of layers of quantum dots on a substrate, wherein each deposited layer in the first plurality of layers is contacted with a solution comprising metal ions and halogen ions before deposition of the next layer; and
depositing a second plurality of layers of quantum dots on the first plurality of layers, wherein each deposited layer in the second plurality of layers of quantum dots is contacted with a ligand solution.

10. The method of claim 9, wherein the solution comprises dimethylformamide.

11. The method of claim 10, further comprising:
contacting each deposited layer in the first plurality of layers with an acetonitrile solution to remove residual dimethylformamide before deposition of the next layer.

12. The method of claim 9, wherein the contacting each layer of the first plurality of layers comprises immersing each layer of the first plurality of layers in the solution for about 1 second to about 60 seconds.

13. The method of claim 9, wherein the metal ions and the halogen ions are provided by a metal halide and the solution comprises a concentration of about 10 mM of the metal halide.

14. The method of claim 9, wherein the ligand solution comprises mercaptopropionic acid and the ligand solution comprises about 10% mercaptopropionic acid and about 90% methanol.

15. The method of claim 13, wherein the metal halide comprises at least one of PbCl₂, PbI₂, CdCl₂, or CdI₂.

16. The method of claim 9, wherein the first plurality of layers and the second plurality of layers have a combined thickness of 300 nm to 750 nm.

17. The method of claim 16, wherein the combined thickness is about 500 nm.

18. The method of claim 9, wherein depositing the first plurality of layers comprises:
depositing a first layer of quantum dots on the substrate;
contacting the first layer with the solution;
depositing a second layer of quantum dots on the first layer;
contacting the second layer with the solution; and depositing one or more additional layers to create the plurality of layers, each deposited layer being contacted with the solution before deposition of a next layer.

19. The method of claim 18, wherein the first layer, the second layer, and the one or more additional layers are deposited by dip coating or spin coating.

20. The method of claim 9, wherein the first plurality of layers comprises 10 to 15 layers of quantum dots.

* * * * *